United States Patent [19]

Rotman et al.

[11] Patent Number: 5,082,606
[45] Date of Patent: Jan. 21, 1992

[54] PROCESS FOR PRODUCING CERAMIC-METAL MULTILAYER COMPONENTS AND APPARATUS FOR CARRYING OUT THE PROCESS

[75] Inventors: Frédéric Rotman, Tokyo, Japan; Yannick Rancon, Velizy, France; Philippe Queille, Viroflay, France; Michel Olivier, Beynes, France

[73] Assignee: L'Air Liquide, Societe Anonyme pour L'Etude et L'Exploitation des Procedes Georges Claude, Paris, France

[21] Appl. No.: 483,182

[22] Filed: Feb. 22, 1990

[30] Foreign Application Priority Data

Feb. 22, 1989 [FR] France ................... 89 02278

[51] Int. Cl.$^5$ .............................. C04B 33/32
[52] U.S. Cl. ..................... 264/40.6; 264/60; 264/61; 264/65
[58] Field of Search ............ 264/61, 60, 65, 40.6

[56] References Cited

U.S. PATENT DOCUMENTS 4,678,683 7/1987 Pasco et al. .................. 427/123

FOREIGN PATENT DOCUMENTS 0209065 1/1987 European Pat. Off. .
0267602 5/1988 European Pat. Off. .

OTHER PUBLICATIONS

Solid-State Technology, vol. 29, No. 9, Sep. 1986, pp. 135-138, Port Washington, N.Y., U.S.; E. A. Hayduk, Jr. et al; "Furnace Atmosphere's Effect on Cofiring Tungsten-Alumina Multilayer Substrates".
Memories Scientifiques de la Revue de Metallurgie, vol. LXIV, Nos. 7/8, 1967, pp. 653-661; L. Guillet et al, "Reduction D'Oxide de fer par L'Hydrogene Pur".

Primary Examiner—James Derrington
Attorney, Agent, or Firm—Browdy and Neimark

[57] ABSTRACT

The invention concerns the production of ceramic-metal multilayer components comrising effecting, after making up in the crude state, in particular by metallization and stacking of pre-cut raw ceramic bands, a simultaneous firing operation, termed cofiring, on the components under an atmosphere based on hydrogen or nitrogen or a mixture of hydrogen and nitrogen, having a regulated water vapor content at a temperature of first of all between 800° C. and 1800° C., and more precisely either at a moderately high temperature plateau between 800° C. and 1300° C. for certain ceramic materials such as codierite and metallic materials such as copper and nickel, or at a temperature plateau between about 1400° C. and 1800° C. for refractory materials such as tungsten, molybdenum, alumina, according to which the atmosphere having a water vapor content is obtained by addition to a vector gas at (13) and (14) of a quantity of additional oxygen (15), and a quantity of additional hydrogen at (14) sufficient to obtain by hydrogen-oxidation reaction the predetermined water vapor content, and determining these quantities of addition of oxygen and the contingent addition of hydrogen so that said water vapor content is, in the course of the cofiring, that which is the most appropriate for the different stages of said cofiring.

7 Claims, 1 Drawing Sheet

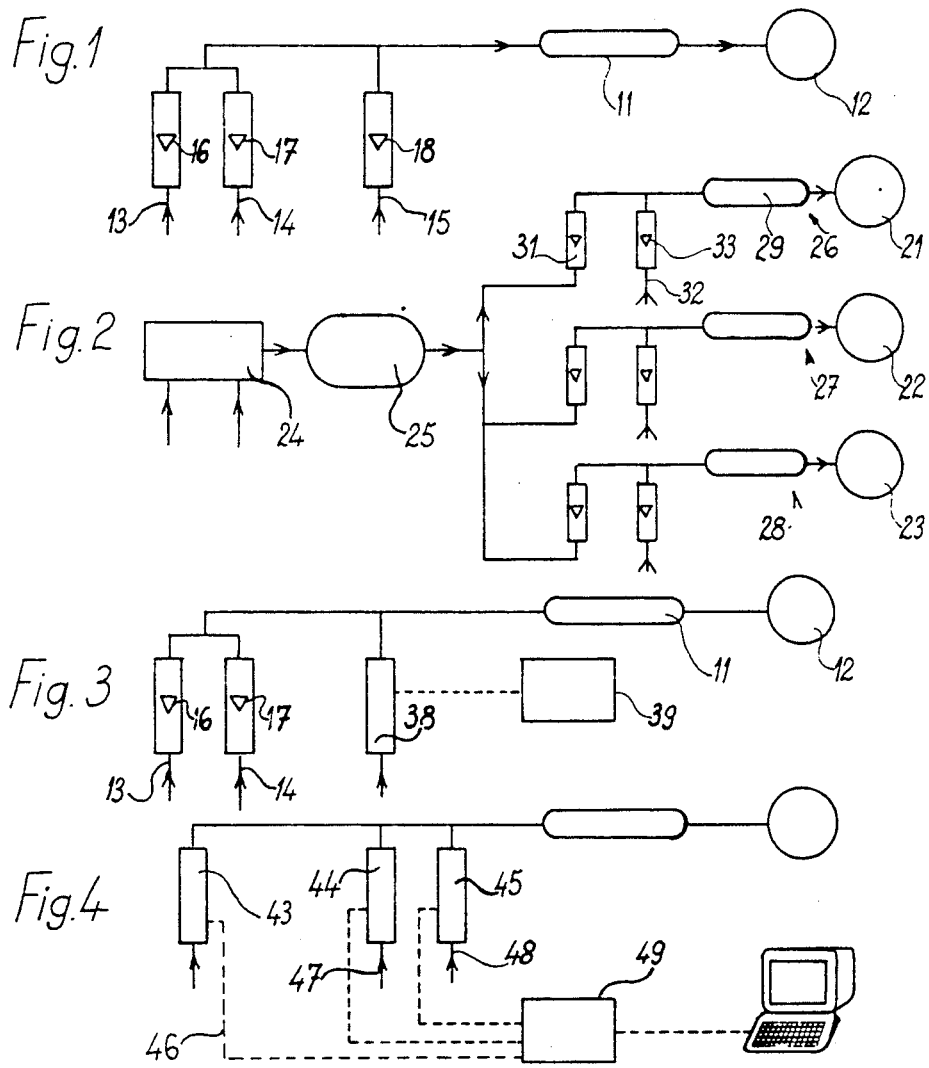

PROCESS FOR PRODUCING CERAMIC-METAL MULTILAYER COMPONENTS AND APPARATUS FOR CARRYING OUT THE PROCESS

FIELD OF INVENTION

The present invention relates to a process for producing ceramic-metal multilayer components comprising effecting, after making up the component in the raw state, in particular by metallization and stacking of pre-cut raw ceramic bands, the simultaneous firing, termed "cofiring" of the ceramic-metal multilayers under an atmosphere having a controlled dew point.

BACKGROUND

The "multilayer" technology is of increasing importance in the field of ceramic components for electronics. It is widely employed for producing passive components such as capacitors, enclosing boxes for integrated circuits and interconnection substrates of hybrid circuits. This technology may be briefly divided up into three steps:

pouring from a barbotine and drying the ceramic in the form of bands whose thickness is usually between 20 and 200 microns;

making up the component in the raw state essentially by a metallization and a stacking of the ceramic layers: the metallization of pre-cut ceramic bands is achieved by deposition, in particular by serigraphy, of an ink whose principal constituent is a metallic powder, so as to form the electrodes of the capacitors, the electrical paths of the enclosing boxes and of the interconnection substrates (in the latter two cases, there must be included the operations for perforating some of the ceramic bands and the metallization of the "vias" thus obtained); the stacking of the metallized layers, followed by a hot pressing (about 150° C.), results in a component in the raw and dry state, with a structure similar to structure it will have after firing;

cofiring the raw components.

The cofiring, sometimes also designated by the term "cosintering", is a complex heat treatment operation having a plurality of successive stages in the course of which it is attempted to achieve:

the elimination of the organic products contained in the "raw" components;

the cosintering proper of the ceramic and metallic layers.

The elimination of the organic products, which must be as complete as possible, is effected in a progressive manner during the rise in temperature. The cosintering is achieved by providing a temperature plateau at a value which is a function of the materials to be treated and is usually between about 800° C. and about 1800° C. The cofiring is achieved at low temperature (from about 800° C. to about 1300° C.) for ceramic materials such as cordierite and metallic materials such as copper and nickel, whereas it is achieved at high temperature (from about 1400° C. to about 1800° C.) for refractory materials such as tungsten, molybdenum, alumina, aluminium nitride. During the cofiring, a densification of the component occurs with linear shrinkages which may attain 20% to 30%. According to the cases, large ceramic-metal interface reactions may also occur. The treatment is terminated by a cooling down to ambient temperature.

This well-known "multilayer" technology is in particular described in respect of refractory materials by B. SCHWARTZ and D. L. WILCOX in the communication entitled "Laminated Ceramics" which appeared in "Proc. Electron Comp. Conf.", WASHINGTON, D.C., 1967.

During this heat treatment operation, the function of the atmosphere is essential. In the course of the first stages of the treatment, the atmosphere must promote and in any case permit the complete elimination of the organic products contained in the raw materials. In the subsequent stages of the treatment, the atmosphere permits controlling the size of the grains, the densification of the component, and acting on the ceramic-metal interface reactions. The atmosphere is also chosen in such manner as to avoid oxidizing certain of the materials employed, principally for the metals, tungsten, molybdenum, copper, and for the ceramics, "non-oxides" such as aluminium nitride. In certain cases, the atmosphere also permits regenerating at higher temperature the metals which would have undergone a partial oxidation when eliminating the binders. These functions of the atmosphere are achieved by regulating its oxydo-reduction potential in the course of the treatment. A simple means of effecting this regulation consists in employing a more-or-less large additional supply of water vapour in an atmosphere constituted by hydrogen and an inert gas such as nitrogen, or if desired, in an atmosphere otherwise constituted solely by hydrogen, or even, on the contrary, in an atmosphere otherwise constituted solely by an inert gas.

The treatment atmospheres which are employed in these cofiring operations must have well-determined water vapour contents since these water vapour contents intervene both as such and in relation in a ratio with the hydrogen content so as to impart to the gas an oxidizing effect, a reducing effect, a neutral effect. The obtaining of moist atmospheres for the cofiring of ceramic-metal multilayers is at the present time achieved by a simple bubbling of the gas in a container containing water. However, this manner of proceeding presents the drawbacks of imposing a dew point roughly equal to the ambient temperature, and fluctuations of the dew point by variation of the ambient temperature and the water level in the bubbler. In order to obtain higher dew points at ambient temperature it is then necessary to heat the water of the bubbler and, if, on the contrary, it is desired to obtain lower dew points at ambient temperature, it is necessary to cool the water of the bubbler or dilute the gas saturated with water with a dry gas. Furthermore, in order to obtain a well-determined dew point, it is at the present time not only necessary to regulate the temperature of the water of the bubbler, and therefore to employ heat insulated baths with thermostats, but also necessary to regulate the water level, and therefore to employ a level probe coupled with an automatic filling device. An arrangement of this type has been found to be costly and, in addition, notwithstanding all these improvements, various drawbacks still subsist:

on one hand, the value of the dew point produced is a function of the geometry of the bubbler (in particular of the water/gas exchange surface), whence the obligation to determine by calibration the operational conditions of each bubbler (heating and dilution) so as to obtain the desired dew points;

on the other hand, in the case where it is desired to change the dew point to a higher dew point, this change, obtained by a heating of the bath, presents the drawback of having a long response time;

lastly, in the case where it is desired to change to a lower dew point, the cooling of the bath presents the same thermal inertia drawback as above, whereas the dilution presents the drawback of a change in the total flow when passing from one dew point to the other.

These drawbacks may certainly be avoided by a quasi-infinite extension of the water/gas exchange surface by passing, for example, through a large volume of porous material as described in the article entitled "Advanced gas Moisturizing System for Ceramic processing applications" by F. W. GIACOBBE, which appeared in "American Ceramic Society Bulletin", Volume 66, No. 10, 1987 and by conservation of the total flow by readjustment of the flows of moisturized gas and dry gas.

However, such a moisturizing system is still hardly flexible. Its construction is very costly and the problem of the thermal inertia, in the case where it is desired to change the temperature of the bath, is still not solved.

SUMMARY AND GENERAL DESCRIPTION OF THE INVENTION

The present invention has for an object to provide equipment which has functions of higher performance and is simple, flexible and cheap. Furthermore, it permits satisfying the need for processes requiring atmospheres having dew points which are both controlled and evolutive, especially necessary in the ceramic-metal cofiring technique.

In the process for cofiring ceramic-metal multilayer components according to the invention, the atmosphere having a water vapour content is obtained by adding to said vector gas a quantity of additional oxygen and a quantity of hydrogen which is contingently additional, sufficient to obtain by catalytic hydrogen-oxidizing reaction said predetermined water vapour content, and contingently said quantities of additional oxygen and the contingent additional hydrogen are so regulated that said water vapour content is, in the course of the cofiring, that which is the most adapted to the different stages of said cofiring.

The applicant is well aware that the intrinsic principle of producing by catalysis a content of water vapour in a gas has already been proposed, in particular in the article entitled "Reduction of iron oxide by pure hydrogen" by L. GUILLET, M. EUDIER and Ph. POUPEAU which appeared in "Mémoires Scientifiques Revue Métallurgique" No. 7/8 1967 in which it is proposed to employ, in a study of the reduction of the iron protoxide, either pure hydrogen or mixtures of hydrogen, water vapour and argon.

However, the applicant has found that, notwithstanding the wide knowledge of the chemical reaction concerned and of the possibility of achieving it by catalytic reaction, no application on an industrial scale in the cofiring of ceramic-metal multilayer components has been proposed up to the present time, notwithstanding the difficulties of obtaining such moist atmospheres according to the aforementioned techniques and notwithstanding the particularly attractive effect of the solution applied in accordance with the invention to the technique in question, where the reproducibility and the precision of the operational conditions of manufacture are primordial, and notwithstanding the advantages of an optimum variation of the water vapour content in the course of the cofiring operation.

The catalyst employed in the process according to the invention is so chosen as to permit an immediate and complete reaction of the oxygen at ambient temperature, with a residual oxygen content lower than 10 vpm. A catalyst which may be employed is of the type palladium on an alumina support which is capable of treating at an hourly flow up to about 5,000 to 10,000 times the volume of the reactor. This type of catalyst usually requires no prior heating of the gas and moreover does not involve a sequence for starting up the reactor with an initial rejection of gas to the open air.

In an application proposed for producing ceramic-metal multilayer components, where the metal is tungsten and/or molybdenum and the ceramic essentially alumina, the treatment atmosphere has a water vapour content of between 2.5% and 8% and a hydrogen content of between 25% and 75%, with a hydrogen content/water vapour content ratio of between 5 and 15.

According to a variant of this aforementioned application, in a first step terminating at the end of the cofiring, the treatment atmosphere has a water vapour content of between 5% and 8% and a ratio of the hydrogen content to the water vapour content of between 5 and 10, and in a second step, which includes the cooling, the treatment atmosphere has a hydrogen content of between 10% and 75% and a ratio of the hydrogen content to the water vapour content of higher than 10.

In another application proposed for producing ceramic-metal multilayer components in which the metal is copper and the ceramic is a composite glass-ceramic or cordierite, in a first step terminating at the end of the cofiring, the treatment atmosphere has a water vapour content of between 2.5% and 8% and a hydrogen content of between 0% and 30%, and in a second step which includes the cooling the ratio of the hydrogen content to the water vapour content is higher than 15 and the hydrogen content is higher than that of said first step.

BRIEF DESCRIPTION OF DRAWING

The features and advantages of the invention will be apparent from the following description given as an example, with reference to the FIGS. 1 to 4 which diagrammatically represent four embodiments of the invention.

DETAILED DESCRIPTION OF EMBODIMENTS

FIG. 1 represents a simplified embodiment in which the three gas constituents nitrogen ($N_2$), hydrogen ($H_2$), oxygen ($O_2$) are conducted to a catalytic chamber 11 and thence to a furnace 12 via supply pipes: 13 for the nitrogen, 14 for the hydrogen, 15 for the oxygen, each pipe 13, 14 and 15 incorporating a float-type flowmeter 16-17-18 equipped with a regulating valve for adjusting the flow. In this way it is easy to use, by a simple regulation of the flows, higher or lower dew points at ambient temperatures.

In FIG. 2 which concerns a common supply for a plurality of furnaces 21, 22, 23, . . . a premixture of nitrogen ($N_2$), hydrogen ($H_2$) is first of all achieved in a mixer 24 and is thereafter conducted to a plurality of utilization stations after passage through a common buffer chamber 25. Each distribution line 26, 27, 28, . . . comprises:

a flowmeter 31 for regulating the flow of the mixture of nitrogen ($N_2$) and hydrogen ($H_2$);

a supply pipe 32 having a flowmeter 33 for regulating the flow of oxygen ($O_2$);

a catalytic chamber 29 for generating water vapour.

In this way, a plurality of furnaces are supplied in parallel and it is possible, for a given mixture $N_2/H_2$, to employ different dew points from one furnace to the other.

In FIG. 3, which is a variant of FIG. 1, in which like elements are designated by like reference numerals, there is achieved a higher stability of the dew point by the provision of a particularly stable flow of oxygen, which is obtained with an apparatus of the type having a mass flow rate regulator 38 equipped with a control 39.

In FIG. 4, three mass flow rate regulators 43, 44 and 45 are employed in the nitrogen pipe 46, the hydrogen pipe 47 and the oxygen pipe 48, coupled with a device 49 controlled by a computer, permitting a dynamic control of the dew point by means of an automatic control of the flows. It is in this way easy to program a dew point profile simultaneously with a thermal profile while conserving a constant total gas flow.

It is of course possible to envisage any combination of these different manners of carrying out the invention.

There will now be given as an example of the use of atmospheres applied to the cofiring of ceramic-metal multilayer components:

EXAMPLE

Use of an atmosphere having a controlled and evolutive dew point for the cosintering of tungsten-alumina multilayer substrates at 1600° C.

For achieving the cosintering, the device shown in FIG. 4 is employed which comprises mass flow rate regulators (precision equal to 1% of the full scale), since the ratio $H_2/H_2O$ is a critical parameter of the cofiring atmosphere. The object is to produce a dew point which is evolutive as a function of the temperature cycle, namely:

a) from the ambient temperature to the end of the cosintering step:

$H_2O$ = 5%
$H_2$ = 40%   $H_2/H_2O$ = 8
$N_2$ = 55% b) during the cooling:

$H_2O$ = 2%
$H_2$ = 40%   $H_2/H_2O$ = 20
$N_2$ = 58%

During the cooling, the atmosphere is rendered more reducing as concerns the tungsten by increasing the ratio $H_2/H_2O$.

The configuration of the apparatus in FIG. 4 makes it possible to easily produce such a sequence owing to the control of the three mass flow rate regulators by means of a computer.

Part (a) of the cycle:

The high water vapour content facilitates the elimination of the binders. Furthermore, the rather low ratio $H_2/H_2O$ (chosen to equal 8) favours the formation of a dense structure of the ceramic.

The mass flow rate regulators are so regulated that there is added to the primary mixture:

$N_2 = 55.0\% \pm 1.0\%$
$H_2 = 45.0\% \pm 1.0\%$
$H_2O < 10$ ppm a current of oxygen equal to
$O_2 = 2.50\% \pm 0.05\%$
(as a percentage of the flow $N_2+H_2$)
to obtain, after passage through the catalytic chamber, the following mixture (calculated proportions):
$N_2 = 55.0\% \pm 1.1\%$
$H_2 = 40.0\% \pm 1.1\%$
$H_2O = 5.0\% \pm 0.2\%$
$O_2 = 0\%$ In the region of a check take-off at the inlet of the catalytic chamber there was analyzed the water vapour content of the mixture $N_2$—$H_2$—$O_2$ before the catalytic reaction and there was measured a dew point lower than $-60°$ C. (10 ppm).

Likewise, by means of a check take-off at the outlet of the catalytic chamber, there was analyzed the gas mixture after catalytic reaction so as to check the content of the different constituents. The hydrogen content was evaluated by a chromatograph, the water vapour content by a hygrometer having a cooled mirror, while the oxygen content was measured by means of an analyzer having an electrolytic cell.

The measured proportions are:
$H_2 = 39.6\% \pm 0.2\%$
$H_2O = 5.08\% \pm 0.06\%$
$O_2 < 5$ ppm Bearing in mind the experimental uncertainties, the measured contents are in full conformity with the calculated contents. This illustrates the ease of operating by a simple regulation of the flows and the fact that therefore no calibration is necessary.

Part (b) of the cycle:

At the end of the cosintering temperature plateau, new flows are set in the mass flow rate regulators so as to avoid oxidizing the tungsten during the cooling. This is achieved by increasing the ratio hydrogen content/water vapour content by decreasing the water vapour content of the mixture.

The mass flow rate regulators are set in such manner that there is added to the primary mixture:
$N_2 = 58.0\% \pm 1.0\%$
$H_2 = 42.0\% \pm 1.0\%$
a current of oxygen equal to
$O_2 = 1.00\% \pm 0.02\%$
(as a percentage of the flow $N_2+H_2$)
to obtain, after passage through the catalytic chamber, the following mixture (calculated contents):
$N_2 = 58.0\% \pm 1.0\%$
$H_2 = 40.0\% \pm 1.0\%$
$H_2O = 2.00\% \pm 0.06\%$ Now, after checking, the dew point of the mixture before passing through the catalytic chamber is lower than $-60°$ C. (10 ppm), and the contents measured experimentally at the outlet of the chamber are:
$H = 39.7\% \pm 0.2\%$
$H O = 1.96\% \pm 0.03\%$
$O < 5$ ppm The measured contents are again in full conformity with the calculated contents, taking into account the experimental uncertainties.

This example illustrates the interest of the invention for the dynamic control of the dew point during the treatment.

We claim:

1. A method of forming multilayered metal-ceramic structures comprising the steps of:

shaping a stack of raw ceramic and metal sheets;

preparing a first controlled atmosphere substantially free of oxygen and comprising nitrogen and hydrogen and between 1% and 8% of water vapor by adding a selected amount of oxygen to substantially dry nitrogen and hydrogen in excess to obtain an intermediary mixture containing hydrogen in excess, and catalytically oxidizing a portion of said hydrogen in said intermediary mixture to obtain said first atmosphere;

co-firing the stack at a temperature greater than 800° C. under said first atmosphere;

forming a second controlled atmosphere different from said first atmosphere, substantially free of oxygen and comprising nitrogen and hydrogen and between 1% and 8% water vapor, by adding a selected amount of oxygen to substantially dry nitrogen and hydrogen to obtain a second intermediary mixture having hydrogen in excess, and catalytically oxidizing a portion of said hydrogen in said second intermediary mixture to obtain said second atmosphere; and cooling the co-fired stack under said second atmosphere.

2. The method of claim 1, wherein the metal is tungsten, molybdenum or a mixture thereof, and the ceramic is alumina, wherein the first controlled atmosphere has a water vapor content between 5% and 8% and a $H_2/H_2O$ ratio between 5 and 10.

3. The method of claim 2, wherein the second controlled atmosphere has an hydrogen content between 10 and 75% and a $H_2/H_2O$ ratio greater than 10.

4. The method of claim 1, wherein the $H_2O$ content in the first and second controlled atmospheres is not greater than 5%.

5. The method of claim 1, wherein the metal is copper and the ceramic is a glass-ceramic composite or cordierite, wherein the first controlled atmosphere has a water vapor content not lower than 2.5% and an hydrogen content not exceeding 30%.

6. The method of claim 5, wherein the second controlled atmosphere has an hydrogen content greater than in the first controlled atmosphere and an $H_2/H_2O$ ratio greater than 15.

7. The method of claim 1, wherein the added oxygen is initially present in the nitrogen which is a raw nitrogen obtained by separation of air by adsorption or permeation.

* * * * *